(12) United States Patent
Oikawa et al.

(10) Patent No.: US 6,651,287 B2
(45) Date of Patent: Nov. 25, 2003

(54) SUBSTRATE CLEANING APPARATUS AND CLEANING MEMBER

(75) Inventors: Fumitoshi Oikawa, Ayase (JP); Koji Atoh, Kawasaki (JP)

(73) Assignee: Ebara Corporation, Tokyo (JP)

( * ) Notice: Subject to any disclaimer, the term of this patent is extended or adjusted under 35 U.S.C. 154(b) by 145 days.

(21) Appl. No.: 09/903,584

(22) Filed: Jul. 13, 2001

(65) Prior Publication Data

US 2002/0004962 A1 Jan. 17, 2002

(30) Foreign Application Priority Data

Jul. 14, 2000 (JP) ......................................... 2000-214250

(51) Int. Cl.[7] .............................. B08B 1/04; B08B 11/00
(52) U.S. Cl. .......................................... 15/102; 15/88.2
(58) Field of Search ..................... 15/77, 88.2, 97.1, 15/102

(56) References Cited

U.S. PATENT DOCUMENTS 5,901,403 A * 5/1999 Yang ............................ 15/180
6,412,134 B1 * 7/2002 Oikawa ........................ 15/102

OTHER PUBLICATIONS

PATENT ABSTRACTS OF JAPAN, entitled "SUBSTRATE CLEANING EQUIPMENT", by Nakabo Yasushi.

* cited by examiner

Primary Examiner—Terrence R. Till
(74) Attorney, Agent, or Firm—Wenderoth, Lind & Ponack, L.L.P.

(57) ABSTRACT

A cleaning apparatus for cleaning a substrate includes a cleaning member, a cleaning member carrier for holding the cleaning member and bringing the cleaning member into contact with a substrate to be cleaned, and a sensor for detecting a presence/absence of a cleaning held by the cleaning member carrier. The substrate is cleaned by causing relative movement between the cleaning member and the substrate while keeping the cleaning member and the substrate in contact with each other.

9 Claims, 18 Drawing Sheets

SUBSTRATE CLEANING APPARATUS AND CLEANING MEMBER

BACKGROUND OF THE INVENTION

The present invention relates to a cleaning apparatus for cleaning a substrate, such as a semiconductor wafer, by using a cleaning member, while the substrate is held and rotated and a cleaning liquid is supplied onto the substrate. The present invention also relates to the cleaning member used in the above-mentioned cleaning apparatus.

FIG. 1 shows an arrangement of a substrate cleaning apparatus of the above-mentioned type. As shown in FIG. 1, the substrate cleaning apparatus comprises a substrate holding/rotating mechanism 10 for holding and rotating a substrate Wf and a cleaning member mount mechanism 20 on which a cleaning member 21 is mounted. The substrate holding/rotating mechanism 10 comprises a plurality of arms 12 (four in FIG. 1) each having a chuck 11 attached thereto for holding the substrate Wf in a horizontal position. The arms 12 are provided to be integral with a base mount 13 which is adapted to be rotated by a rotary shaft 14 in a direction indicated by an arrow A.

The cleaning member mount mechanism 20 has a pivot arm 23. A rotary shaft 22 is connected to a forward end of the pivot arm 23 and the cleaning member 21 is attached to a lower end of the rotary shaft 22. The rotary shaft 22 is adapted to be rotated by a rotating mechanism (not shown) in a direction indicated by an arrow B, thus rotating the cleaning member 21 in the same direction. Further, a pivot shaft 24 is connected to a rear end portion of the pivot arm 23 and adapted to pivotally move the pivot arm 23 in directions indicated by arrows C. The pivot shaft 24 is also adapted to vertically move the pivot arm 23 in directions indicated by arrows D.

As shown in FIG. 2(a), the cleaning member 21 comprises a cleaning element 21a made of a sponge and a holding element 21b for holding the cleaning element 21a. This cleaning member 21 is fixed to the rotary shaft 22 and the cleaning element 21a is brought into abutment with an upper surface of the substrate Wf. At the same time, a cleaning liquid is supplied from a nozzle 25 onto the substrate Wf and the rotary shaft 22 is rotated, while the pivot arm 23 is pivotally moved, to thereby clean the upper surface of the substrate Wf When a force of rotation of the rotary shaft 22 and a force of pivotal movement of the pivot arm 23 are transmitted to the cleaning element 21a, the cleaning element 21a can be detached from the holding element 21b as shown in FIG. 2(b), due to the effect of frictional force generated between the cleaning element 21a and the substrate Wf. This deteriorates a cleaning performance and, if such detachment of the cleaning element is not detected, the apparatus continues to produce insufficiently cleaned products.

SUMMARY OF THE INVENTION

In view of the above, the present invention has been made. It is an object of the present invention to provide a substrate cleaning apparatus having a cleaning element detecting sensor for detecting a presence/absence of a cleaning element of a cleaning member attached to a cleaning member mount mechanism, and which is capable of surely detecting detachment of the cleaning element during a cleaning operation and preventing continuous production of insufficiently cleaned products.

It is another object of the present invention to provide a cleaning member which is free from a problem such as detachment of a cleaning element from a holding element In accordance with the present invention, there is provided a cleaning apparatus for cleaning a substrate, comprising: a cleaning member; a cleaning member carrier for holding the cleaning member and bringing the cleaning member into contact with a substrate to be cleaned; and a sensor for detecting a presence/absence of a cleaning member held by the cleaning member carrier. The substrate is cleaned by causing relative movement between the cleaning member and the substrate while keeping the cleaning member and the substrate in contact with each other.

By providing the cleaning member sensor, accidental detachment of the cleaning member can be surely detected. Therefore, operation of the substrate cleaning apparatus can be stopped at the time of detection of detachment of the cleaning element, thus preventing production of insufficiently cleaned products.

The cleaning apparatus may further comprises a substrate holding device for holding the substrate, the cleaning member carrier is movable between a cleaning position where the cleaning member is brought into contact with the substrate held by the substrate holding device and a retracted position where the cleaning member is out of contact with the substrate. The cleaning member sensor may be provided at the retracted position to detect a presence/absence of the cleaning member held by the cleaning member carrier positioned at the retracted position.

By this arrangement, the cleaning member sensor can be easily set to a position such that movement of the cleaning member carrier during a cleaning operation is not disturbed.

The sensor may be provided on the cleaning member carrier to detect a presence/absence of the cleaning member held by the cleaning member carrier.

The present invention further provides a substrate cleaning member for use in a substrate cleaning apparatus, the cleaning member being adapted to be held and brought into contact with a substrate for cleaning by a cleaning member carrier of the substrate cleaning apparatus. The cleaning member has a fitting portion to be held by a cleaning member carrier, the portion having a large diameter head portion and a small diameter neck portion integrally connected to the large head portion to enable the cleaning member carrier to securely hold the cleaning member by grasping the fitting portion. The substrate cleaning member may further comprises a cleaning portion integrally connected to the small diameter neck portion at an end thereof opposite to the other end at which the large diameter head portion is connected, the cleaning member has a diameter larger than that of the small diameter neck portion. Specifically, the large diameter head portion, the small diameter neck portion and the cleaning portion are each cylindrical and coaxial with each other. A corner portion of the portion of the cleaning portion to be brought into contact with a substrate may be angular in vertical cross-section. By this arrangement, an edge of the substrate can be included in the range of area to be cleaned. Since the corner portion is made angular (not curved), the range of area to be cleaned does not change even when the pressure applied to the cleaning member changes.

The cleaning member carrier of the above-stated cleaning apparatus may comprise a cleaning member holder having an inner space configured to securely receive the large diameter head portion, the small diameter neck portion and a portion of the cleaning portion adjacent to the small diameter neck portion. The cleaning member holder consists of a plurality of segments which are releasably assembled into the cleaning member for holding the cleaning member.

The cleaning member holder further comprises an inner wall defining the inner space and at least one protrusion provided on the inner wall to be pressed into the cleaning member when the cleaning member has been held by the cleaning member holder.

With this arrangement, the protrusion bites into (pierce) the cleaning member. Therefore, a force of rotation of the holding elements can be surely transmitted to the cleaning element and idle rotation of the cleaning element in the holding elements can be prevented.

The foregoing and other objects, features and advantages of the present invention will be apparent from the following detailed description and appended claims taken in connection with the accompanying drawings.

DETAILED DESCRIPTION OF THE INVENTION

Figure 1:
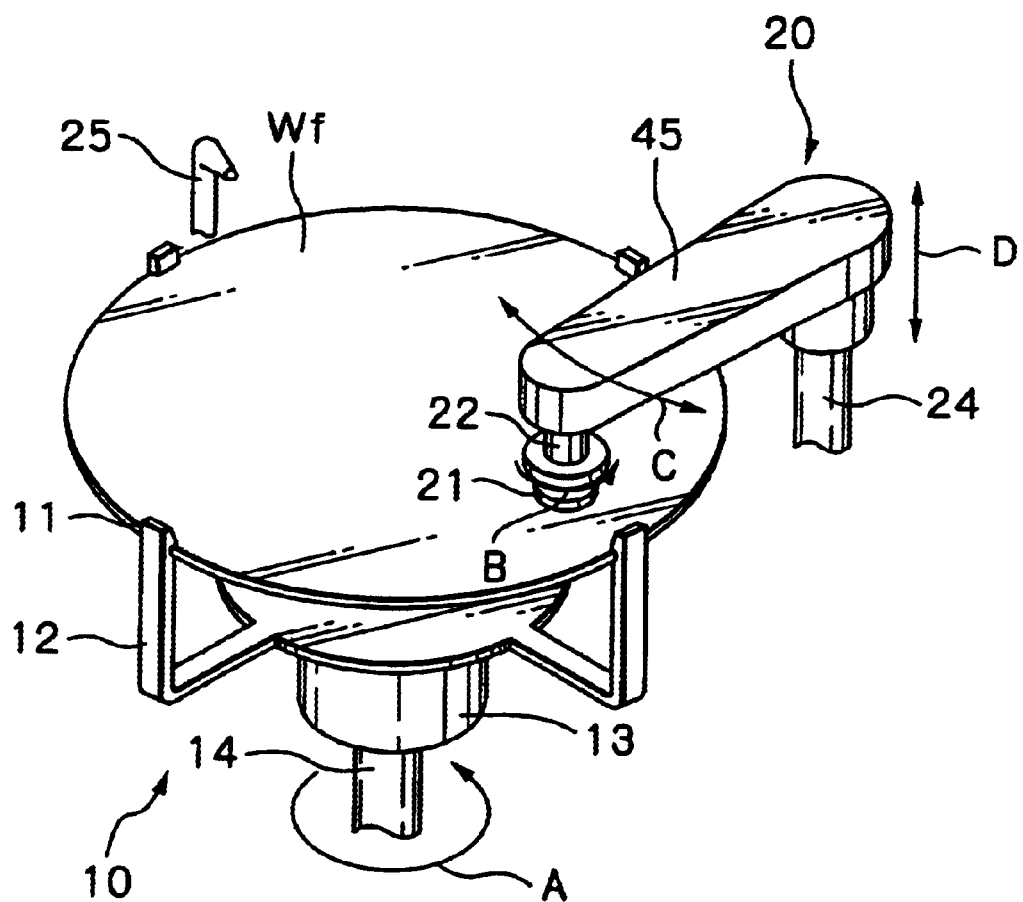
FIG. 1 is a view showing an arrangement of a conventional substrate cleaning apparatus.
Figure 2A:
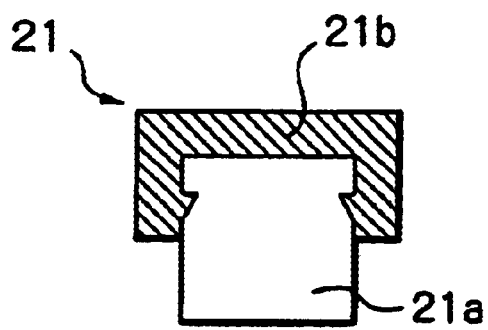
FIG. 2(a) is a cross-sectional view of a conventional cleaning member in a normal condition.
Figure 2B:
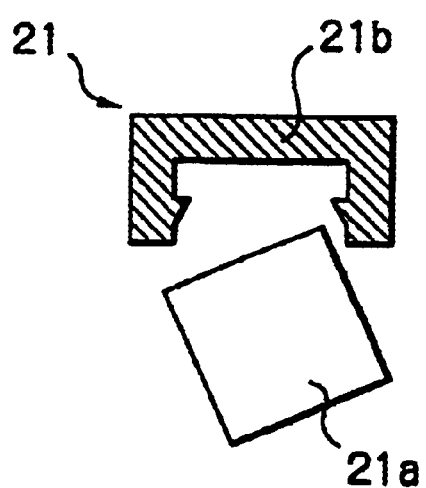
FIG. 2(b) is a cross-sectional view of the conventional cleaning member when a cleaning element is detached from a holding element.
Figure 3:
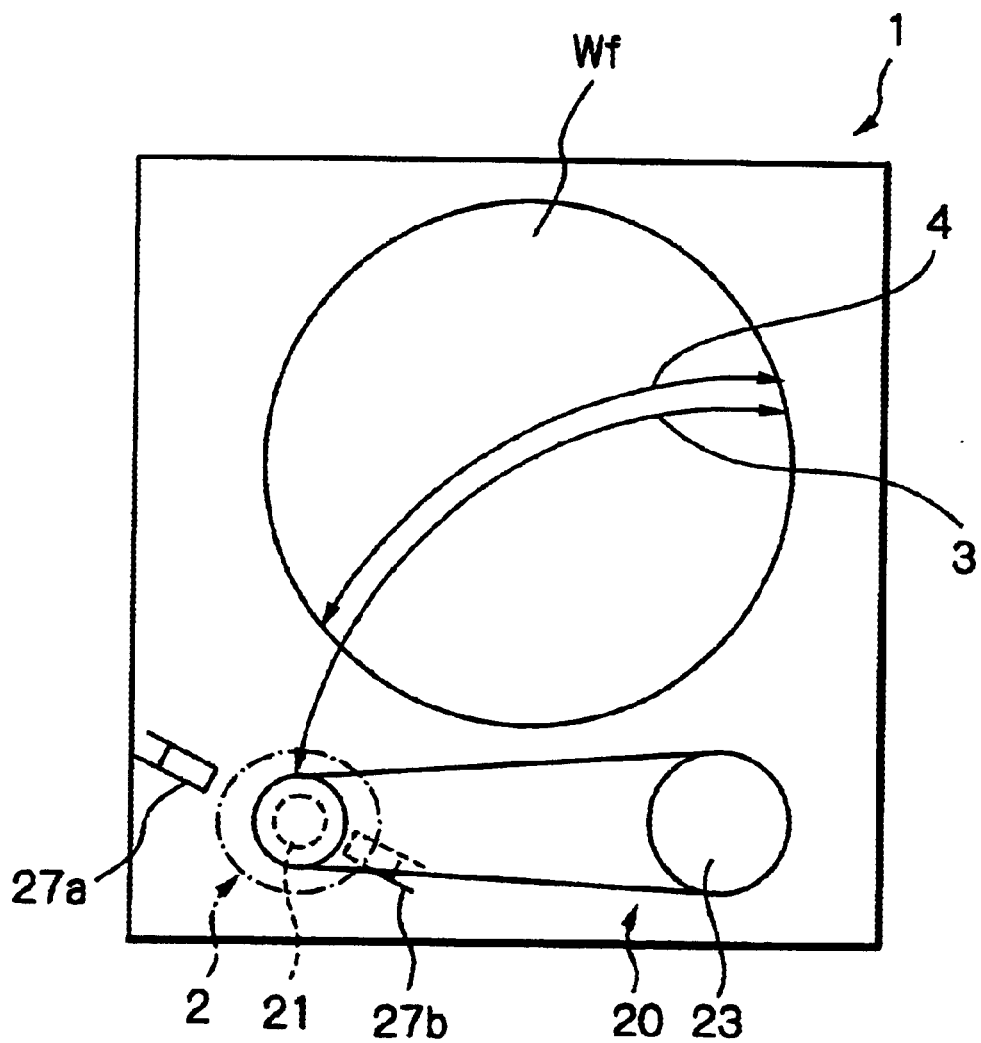
FIG. 3 is a plan view showing an arrangement of a substrate cleaning apparatus of the present Invention.

Hereinbelow, embodiments of the present invention are described, referring to the drawings. FIG. 3 is a plan view showing an arrangement of a substrate cleaning apparatus according to an embodiment of the present invention. The substrate cleaning apparatus of FIG. 3 has the same general appearance as that of the apparatus shown in FIG. 1, and is therefore not Illustrated in the drawings. To clean the substrate, the pivot arm 23 of the cleaning member mount mechanism 20 of a substrate cleaning apparatus 1 moves pivotally within a range indicated by arrows 4 above the substrate Wf. While a cleaning liquid is supplied from the nozzle 25 (see FIG. 1) onto the substrate Wf, the substrate Wf is cleaned by the cleaning member 21 which is rotating. The pivot arm 23 of the cleaning member mount mechanism 20 is capable of pivotally moving in a range as indicated by arrows 3, and the cleaning member 21 attached to the forward end of the pivot arm 23 is adapted to stand by at a standby position 2.

Figure 4A:
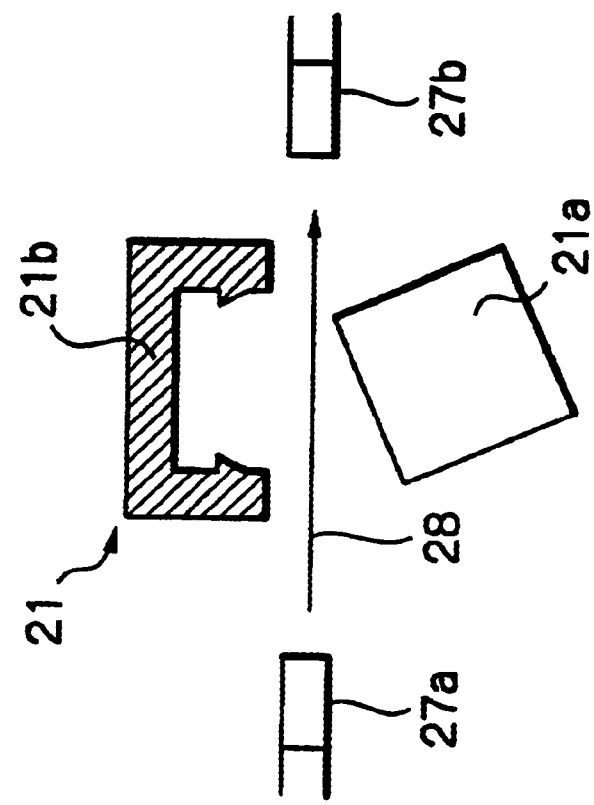
FIG. 4(a) is a view showing a state of operation of a cleaning element sensor of the substrate cleaning apparatus of the present invention when a cleaning element is in a normal condition.
Figure 4B:
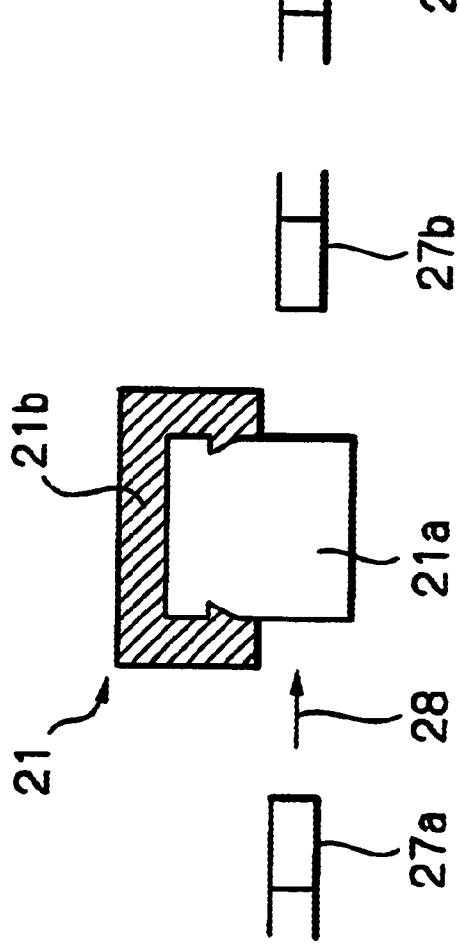
FIG. 4(b) is a view corresponding to FIG. 4(a) when the cleaning element is detached from the holding element.

A light-emitting device 27a and a light-receiving device 27b are disposed on opposite sides of the standby position 2. The light-emitting device 27a and the light-receiving device 27b provide a cleaning element sensor for detecting a presence/absence of the cleaning element 21a of the cleaning member 21. As shown in FIGS. 4(a) and 4(b), the cleaning member 21 comprises the cleaning element 21a and the holding element 21b for holding the cleaning element 21a. In a state where the cleaning member 21 is positioned at the standby position 2 and the cleaning element 21a is held by the holding element 21b in a normal condition, as shown in FIG. 4(a), light 28 emitted from the light-emitting device 27a is blocked by the cleaning element 21a and does not reach the light-receiving device 27b. However, as shown in FIG. 4(b), when the cleaning element 21a has been detached from the holding element 21b, the light 28 from the light-emitting device 27a reaches the light-receiving device 27b. Therefore, a presence/absence of the cleaning element 21a is determined by detecting whether the light 28 from the light-emitting device 27a reaches the light-receiving device 27b when the cleaning member 21 is positioned at the standby position 2.

Figure 5B:
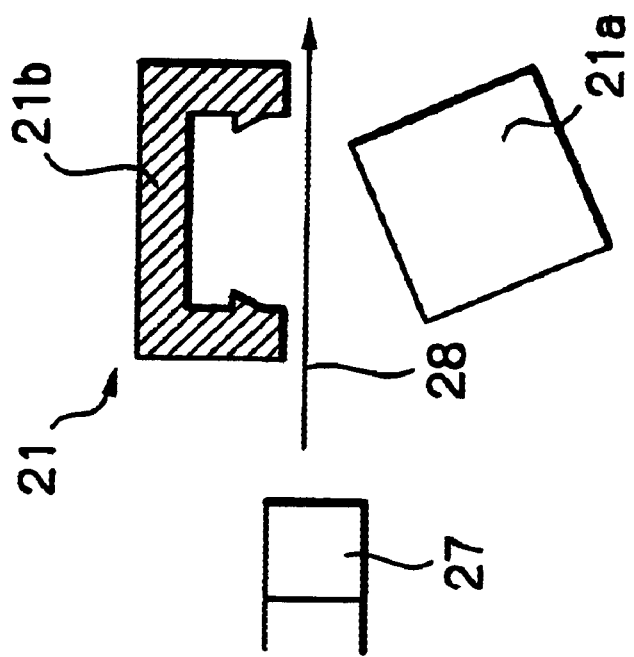
FIG. 5(b) is a view corresponding to FIG. 5(a) when the cleaning element is detached from the holding element.
Figure 5A:
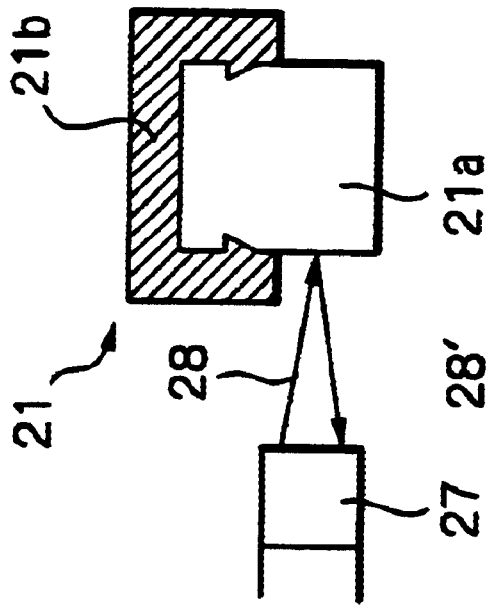
FIG. 5(a) is a view showing a state of operation of a cleaning element sensor of the substrate cleaning apparatus of the present invention when the cleaning element is in a normal condition.

Instead of the light-receiving device 27b and the light-emitting device 27a, as shown in FIGS. 5(a) and 5(b), a light-emitting/receiving device 27 as a single unit may be provided. By this arrangement, as shown in FIG. 5(a), in a state where the cleaning element 21a is held by the holding element 21b in a normal condition, the light 28 from the light-emitting/receiving device 27 is reflected by the cleaning element 21a, thus forming reflected light 28', and reaches the light-emitting/receiving device 27. However, as shown in FIG. 5(b), when the cleaning element 21a has been detached from the holding element 21b, the light 28 emitted from the light-emitting/receiving device 27 is not reflected and does not reach the light-emitting/receiving device 27. Therefore, a presence/absence of the cleaning element 21a is determined by detecting whether the light from the light-emitting/receiving device 27 reaches the light-emitting/receiving device 27 when the cleaning member 21 is positioned at the standby position 2.

Figure 6:
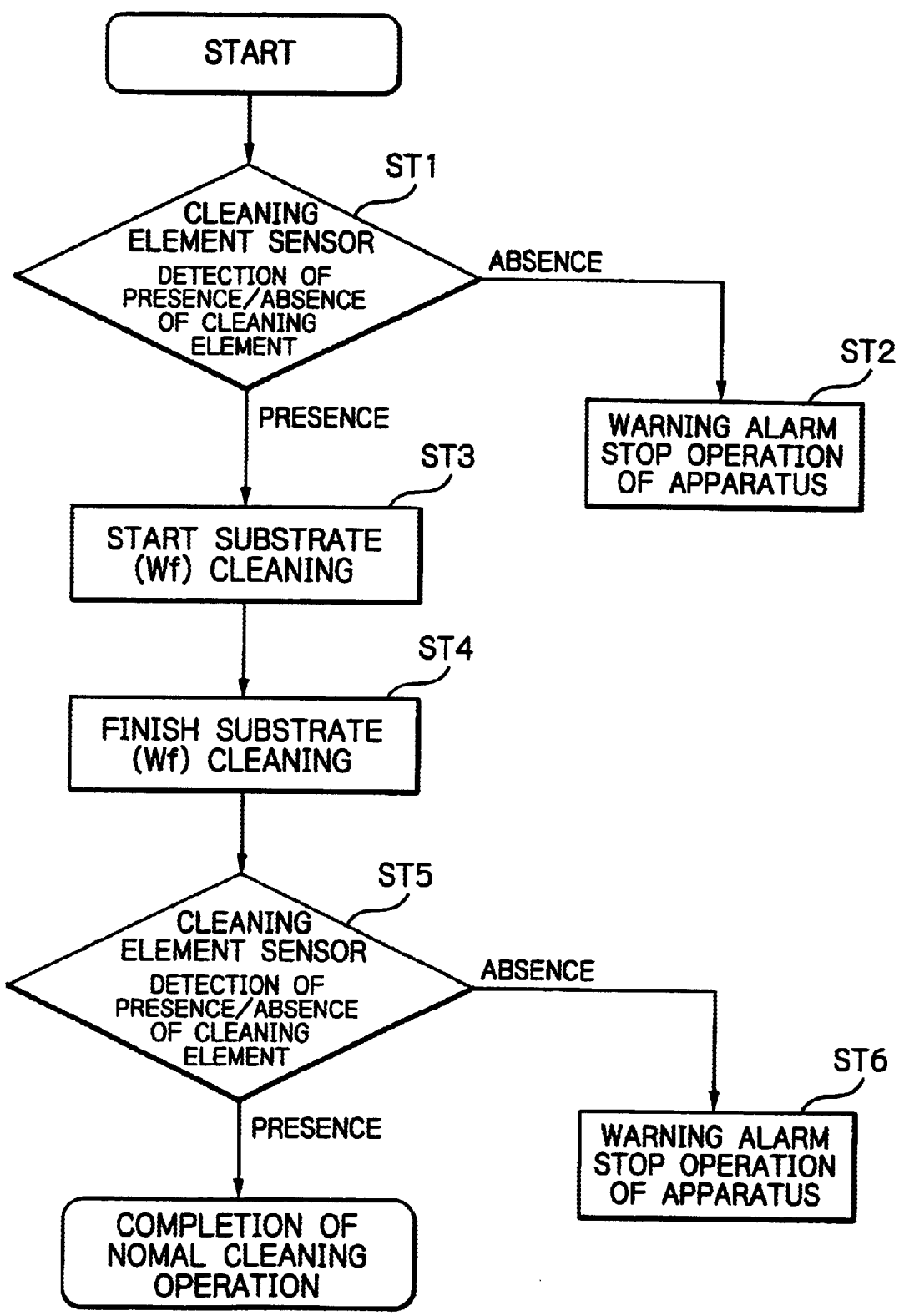
FIG. 6 is a flow chart indicating how a control device processes output signals from the cleaning element sensor of the substrate cleaning apparatus of the present invention.

A sensor signal from the light-receiving device 27b or the light-emitting/receiving device 27 providing the cleaning element sensor is transmitted to a control device (not shown). The control device conducts predetermined processing. FIG. 6 is a flow chart indicating an operation of the control device. First, at the start of a cleaning operation, a presence/absence of the cleaning element 21a is detected from an output of the cleaning element sensor (step ST1). If the cleaning element 21a is absent, a warning alarm is generated and an operation of the substrate cleaning apparatus is stopped (step ST2). If the cleaning element 21a is present, the cleaning operation for cleaning a substrate Wf Is started (step ST3). When the cleaning operation for the substrate Wf has been finished (step ST4), a presence/absence of the cleaning element 21a is detected by the cleaning element sensor (step ST5). If the cleaning element 21a is absent, a warning alarm is generated and the operation of the substrate cleaning apparatus is stopped (step ST6). When the cleaning element 21a is present, it is determined that a normal cleaning operation has been conducted with respect to the substrate Wf and the cleaning operation is complete.

Figure 17:
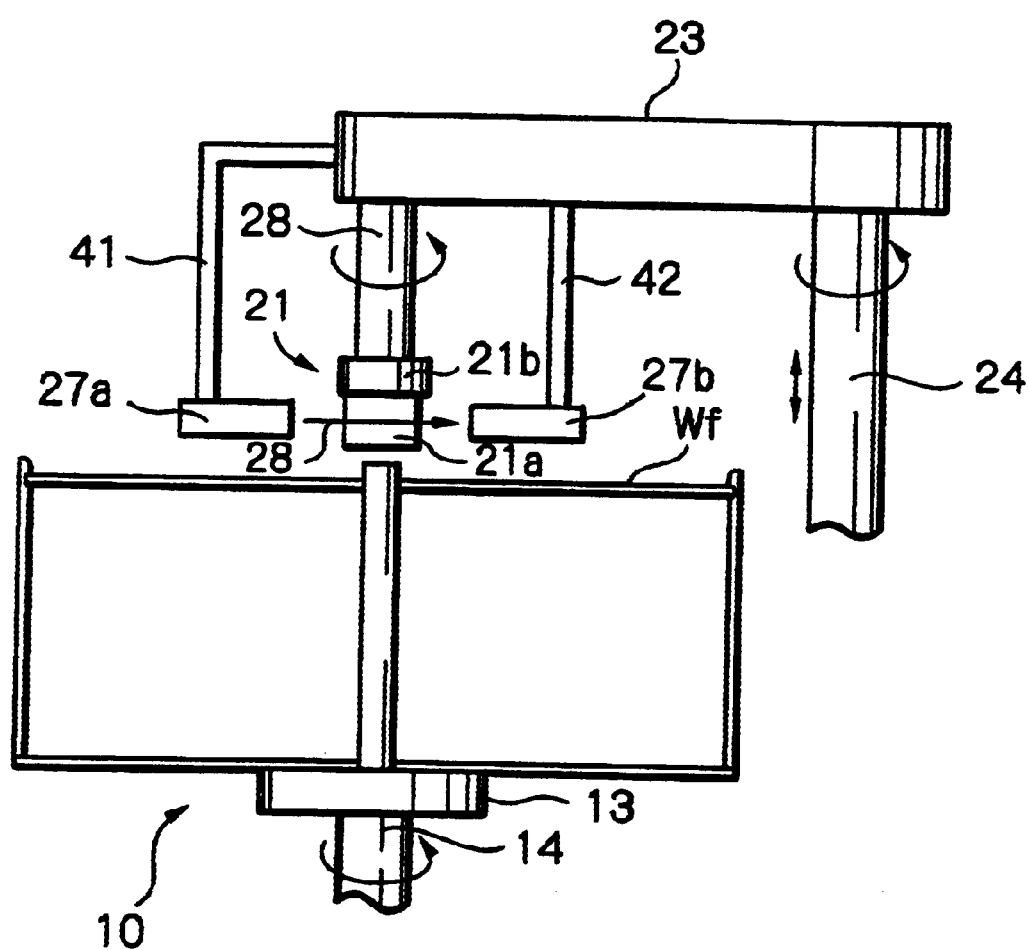
FIG. 17 is a side view showing an arrangement of the substrate cleaning apparatus of the present invention.

In the above-mentioned embodiment, the light-emitting device 27a and the light-receiving device 27b providing the cleaning element sensor are disposed stationary at the standby position 2. However, dispositions of the light-emitting device 27a and the light-receiving device 27b are not limited to this embodiment. For example, as shown in FIG. 17, the light-emitting device 27a and the light-receiving device 27b may be attached to the pivot arm 23 through support members 41 and 42 in such a manner that the light emitting device 27a and the light-receiving device 27b are positioned on the opposite side of the cleaning element 21a of the cleaning member 21. By this arrangement, a presence/absence of the cleaning element 21a can be confirmed constantly during cleaning of the substrate.

Although FIG. 17 shows a transmission type sensor comprising the light-emitting device 27a and the light-receiving device 27b disposed on opposite sides of the cleaning element 21a, the light-emitting/receiving device 27 shown in FIGS. 5(a) and 5(b) may be attached to the pivot arm 23 through an appropriate support member.

Figure 7:
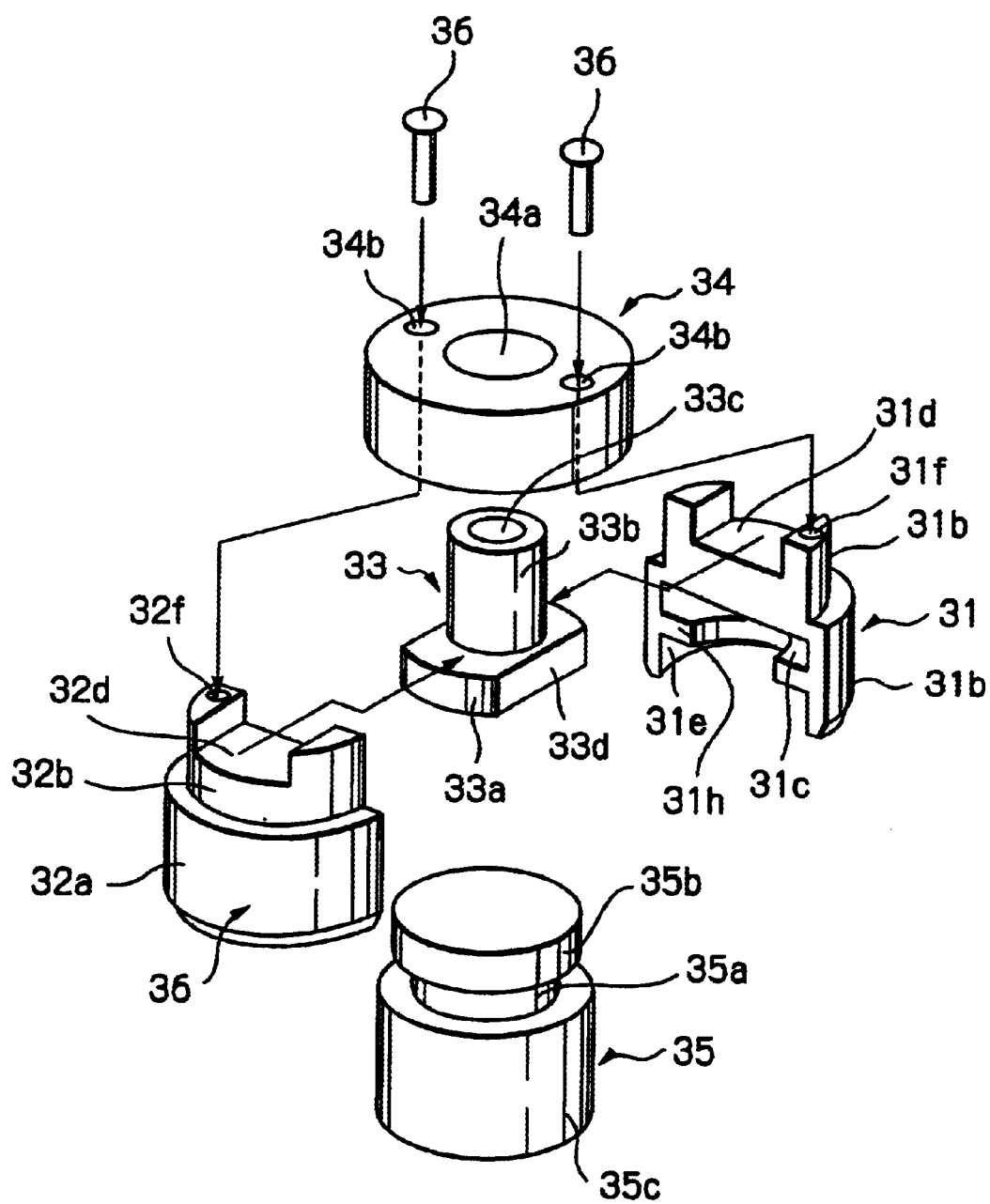
FIG. 7 is an exploded perspective view showing an arrangement of a cleaning member of the present invention.
Figure 8:
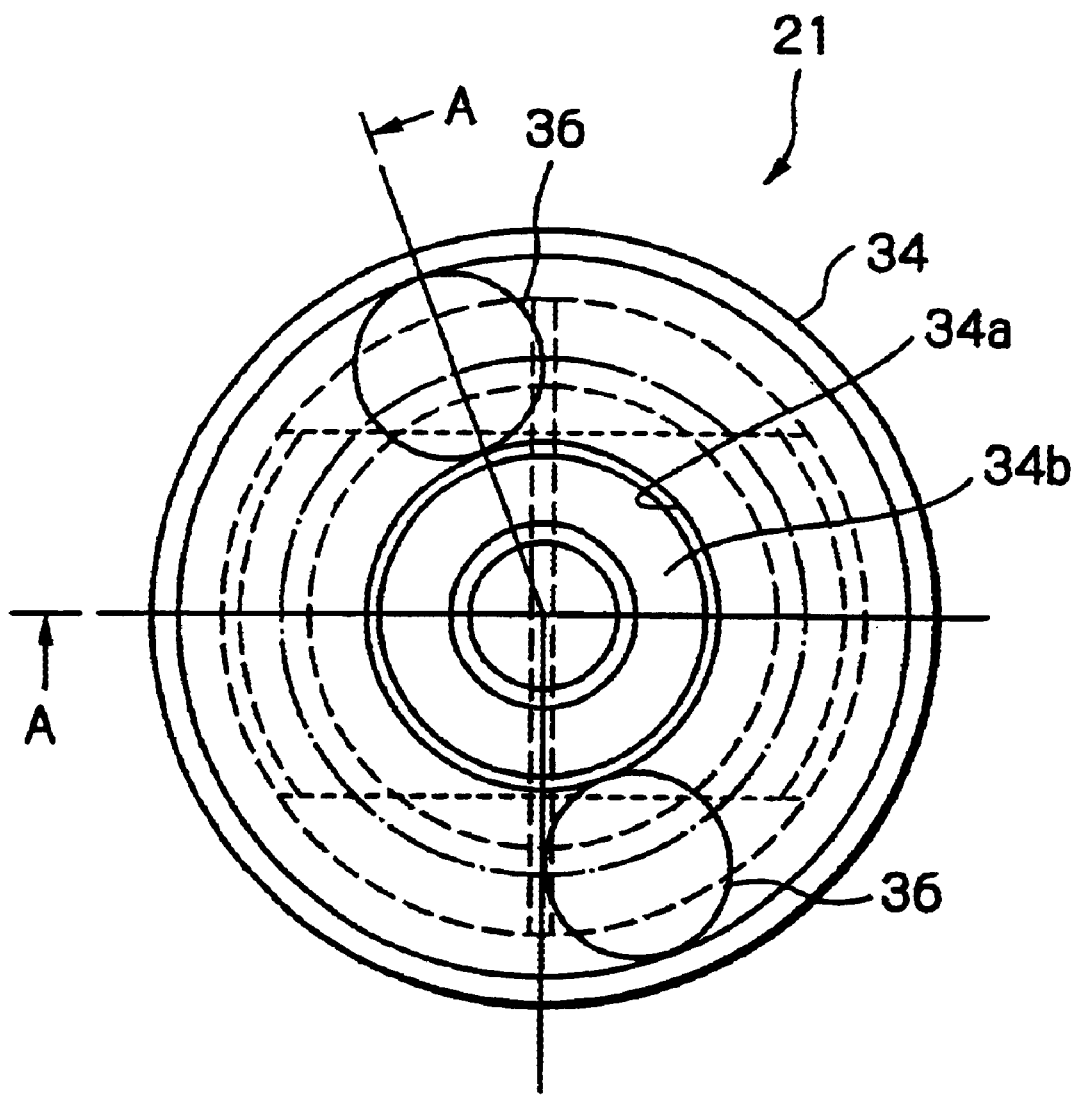
FIG. 8 is a plan view of the cleaning member of the present invention.
Figure 9:
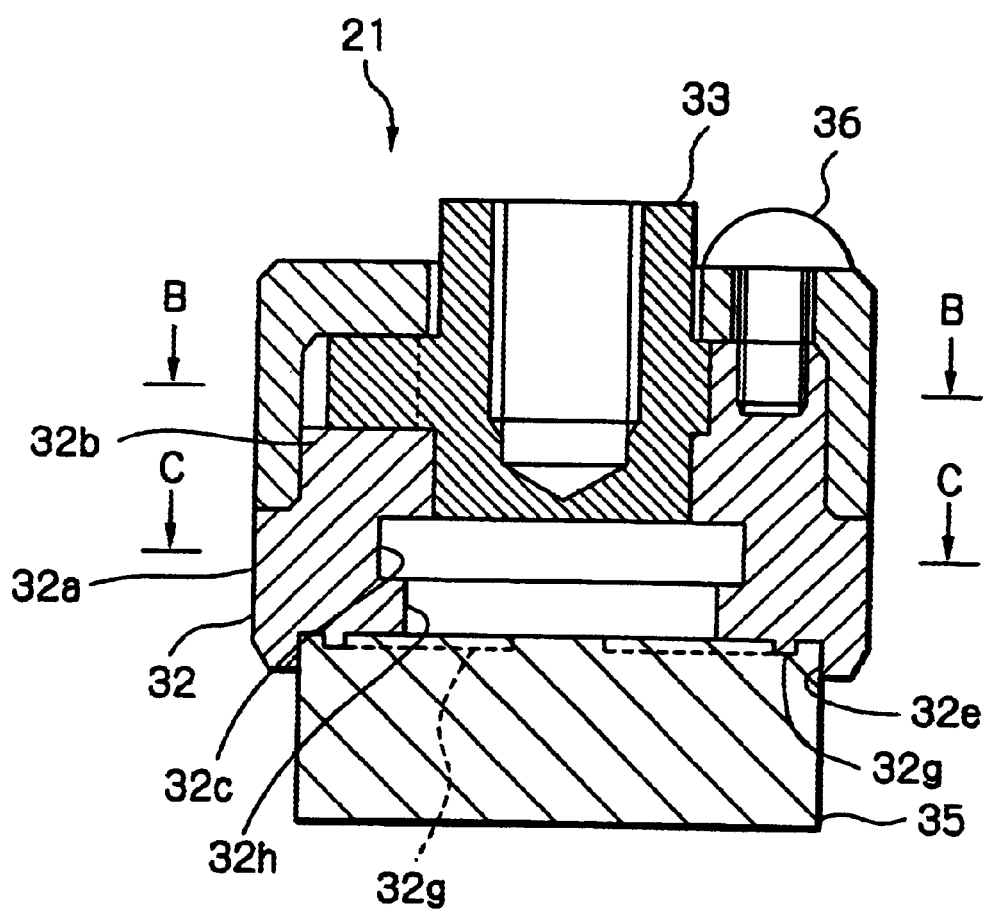
FIG. 9 is a cross-sectional view, taken along the line A—A in FIG. 8.
Figure 10:
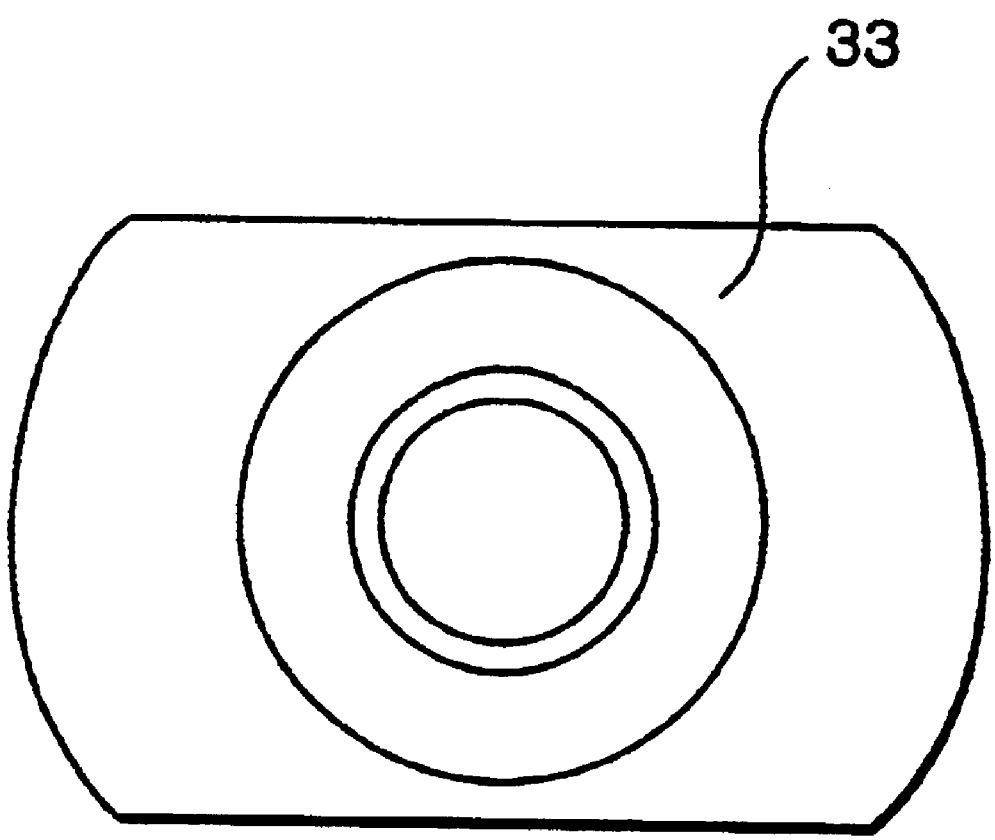
FIG. 10 is a plan view of a driving force transmission member of the cleaning member of the present invention.
Figure 11:
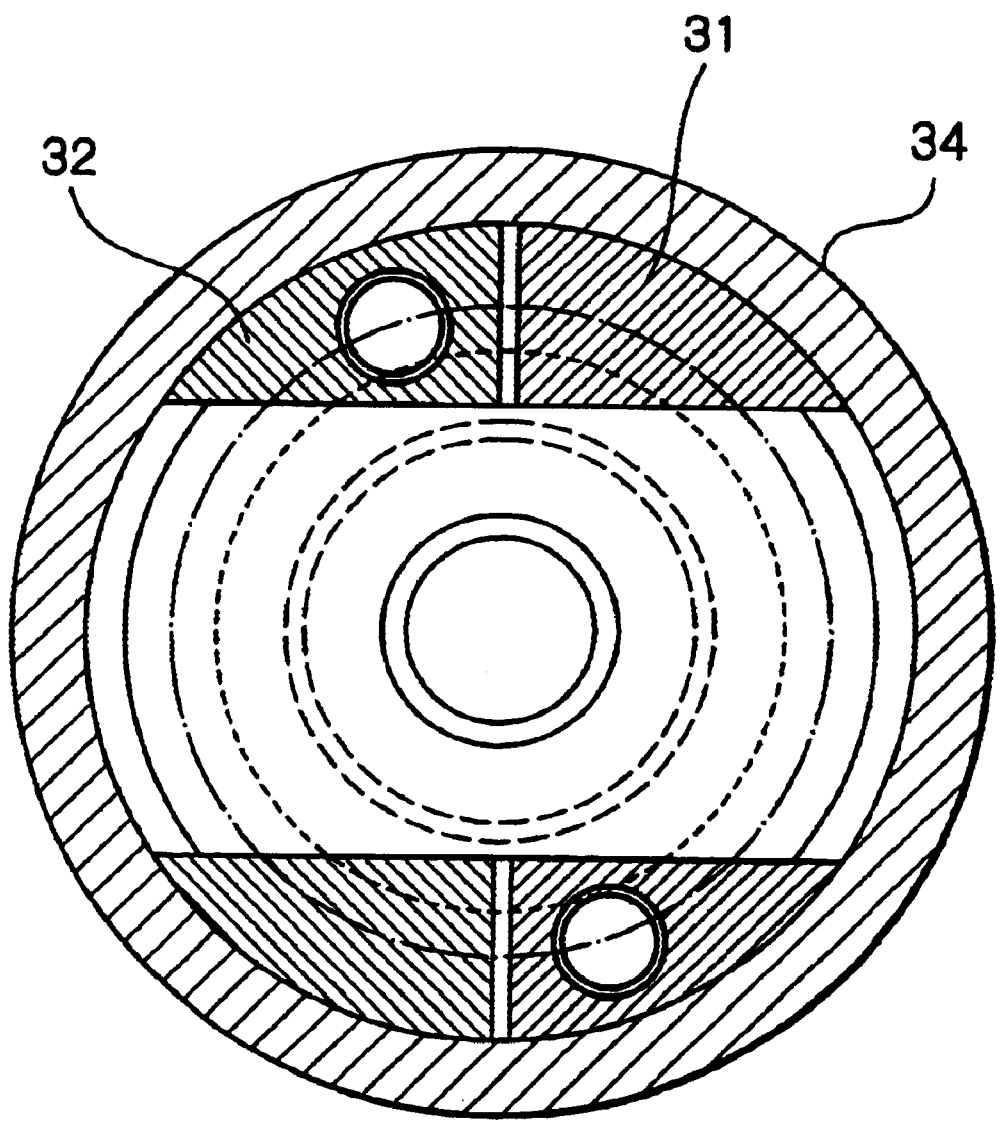
FIG. 11 is a cross-sectional view, taken along the line B—B in FIG. 9.
Figure 12:
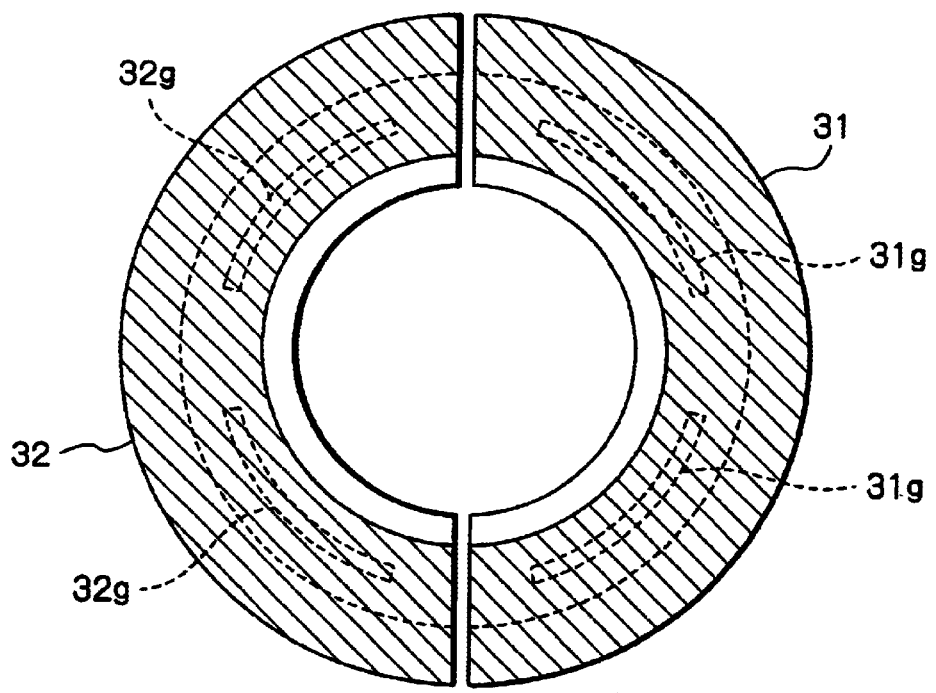
FIG. 12 is a cross-sectional view, taken along the line C—C in FIG. 9.

FIGS. 7 to 12 are views showing an arrangement of a cleaning member according to an embodiment of the present invention. FIG. 7 and FIG. 8 are, respectively, an exploded perspective view and a plan view of the cleaning member. FIG. 9 is a cross-sectional view, taken along the line A—A in FIG. 8. FIG. 10 is a plan view of a driving force transmission member. FIG. 11 is a cross-sectional view, taken along the line B—B in FIG. 9. FIG. 12 is a cross-sectional view, taken along the line C—C in FIG. 9. The cleaning member comprises a pair of semi-cylindrical holding elements 31 and 32, a driving force transmission member 33, a cylindrical fastening member 34, a cleaning element 35 and screws 36.

The cleaning element 35 is made of a cylindrical PVA (polyvinyl alcohol) sponge [=porous matrix PVF (polyvinyl formal)]. The cleaning element 35 comprises a small-diameter intermediate portion 35a (obtained by forming a recess in an outer circumferential surface of the cleaning element 35) formed at a portion to be held by the holding elements 31 and 32, an upper large-diameter portion 35b in a flange-like form disposed at the top of the small-diameter intermediate portion 35a and a lower large-diameter portion 35c in a cylindrical form disposed at the bottom of the small-diameter intermediate portion 35a.

The holding element 31 and the holding element 32, respectively, comprise lower large-diameter portions 31a and 32a and upper small-diameter portions 31b and 32b. A recess 31c into which the upper large-diameter portion 35b of the cleaning element 35 is adapted to be fitted is formed inside an upper portion of the lower large-diameter portion 31a of the holding element 31. A recess 31d into which a base mount portion 33a of the driving force transmission member 33 is adapted to be fitted is formed at an upper portion of the upper small-diameter portion 31b. Further, a recess 32c into which the upper large-diameter portion 35b of the cleaning element 35 is adapted to be fitted is formed inside an upper portion of the lower large-diameter portion 32a of the holding element 32. A recess 32d into which the base mount portion 33a of the driving force transmission member 33 is adapted to be fitted is formed at an upper portion of the upper small-diameter portion 32b.

The driving force transmission member 33 includes the base mount portion 33a in a form obtained by cutting a circular plate so as to form opposite side surfaces 33d. A cylindrical portion 33b is formed vertically on an upper surface of the base mount portion 33a. A mounting threaded opening 33c is formed at a central portion of the cylindrical portion 33b so as to receive the forward end of the rotary shaft 22 of the cleaning member mount mechanism 20 shown in FIG. 1. The base mount portion 33a of the driving force transmission member 33 is adapted to be fitted into the recesses 31d and 32d of the upper small-diameter portions 31b and 32b of the holding elements 31 and 32. When the base mount portion 33a is fitted Into the recesses 31d and 32d, the opposite side surfaces 33d make intimate contact with opposite side wall surfaces of the recesses 31d and 32d. Further, recesses 31e and 32e are formed inside lower portions of the lower large-diameter portions 31a and 32a of the holding elements 31 and 32 so as to receive an upper end portion of the lower large-diameter portion 35c of the cleaning element 35. Flanges 31h and 32h adapted to be fitted into the small-diameter intermediate portion 35a of the cleaning element 35 are formed, respectively, between the recess 31e and the recess 31c, and between the recess 32e and the recess 32c.

The cylindrical fastening member 34 has an inner diameter such that the upper small-diameter portions 31b and 32b of the holding elements 31 and 32 can be fitted into the fastening member 34. Further, an opening 34a into which the cylindrical portion 33b of the driving force transmission member 33 is adapted to be fitted is formed at an upper central portion of the fastening member 34. Openings 34b into which the screws 36 are adapted to be inserted are formed in the fastening member 34.

The cleaning member 21 arranged as mentioned above is assembled in a manner described below. First, the upper large-diameter portion 35b of the cleaning element 35 is inserted into the recesses 31c and 32c of the holding elements 31 and 32 and an upper portion of the lower large-diameter portion 35c of the cleaning element 35 is inserted into the recesses 31e and 32e of the holding elements 31 and 32, thus holding the cleaning element 35 by the holding elements 31 and 32.

Subsequently, the base mount portion 33a of the driving force transmission member 33 is inserted into the recesses 31d and 32d of the upper small-diameter portions 31b and 32b of the holding elements 31 and 32. In this state, the upper small-diameter portions 31b and 32b of the holding elements 31 and 32 are inserted into the fastening member 34, and the cylindrical portion 33b of the driving force transmission member 33 is inserted into the opening 34a of the cylindrical fastening member 34.

Then, the screws 36 are threadably engaged through the openings 34b of the cylindrical fastening member 34 with screw openings 31f and 32f formed at the upper small-diameter portions 31b and 32b of the holding elements 31 and 32. The fastening member 34, the holding elements 31 and 32, the driving force transmission member 33 and the cleaning element 35 are assembled in the above-mentioned manner, so as to form an integral body.

The recesses 31e and 32e of the holding elements 31 and 32 include a plurality of arcuate protruding portions 31g and 32g (four arcuate protruding portions, two for each recess, are shown in FIG. 12) which are adapted to be brought into abutment with an upper surface of the lower large-diameter portion 35c of the cleaning element 35. When the holding elements 31 and 32 are fastened by means of the screws 36, the protruding portions 31g and 32g bite into (pierce) the upper surface of the lower large-diameter portion 35c of the cleaning element 35. Therefore, the cleaning element 35 is rotated simultaneously with rotation of the holding elements 31 and 32. That is, no problem arises of idle rotation of the cleaning element.

In the cleaning member 21 assembled in the above-mentioned manner, the driving force transmission member 33 is rotated by rotating the rotary shaft 22 of the cleaning member mount mechanism 20 (see FIG. 1), which is mounted in the mounting threaded opening 33c formed at the cylindrical portion 33b of the driving force transmission member 33. In this instance, the opposite side surfaces 33d of the base mount portion 33a of the driving force transmission member 33 are in intimate contact with the wall surfaces of the recesses 31d and 32d of the upper small-diameter portions 31b and 32b of the holding elements 31 and 32. Therefore, the force of rotation of the driving force transmission member 33 is transmitted from the side surfaces 33d of the base mount portion 33a to the holding elements 31 and 32 through surface contact therebetween, and the holding elements 31 and 32 are rotated. In this instance, by means of the protruding portions 31g and 32g of the holding elements 31 and 32 which bite into the upper surface of the lower large-diameter portion 35c of the cleaning element 35, it is possible to prevent idle rotation of the cleaning element 35 when a frictional force is generated between a lower end surface of the cleaning element 35 and the substrate which abuts against the cleaning element 35.

As mentioned above, the cleaning element 35 of the cleaning member 21 has a small-diameter intermediate portion 35a at a portion thereof to be held by the holding elements 31 and 32, and the upper large-diameter portion 35b in a flange-like form is disposed at the top of the small-diameter intermediate portion 35a and the lower large-diameter portion 35c in a cylindrical form is disposed at the bottom of the small-diameter intermediate portion 35a. The upper large-diameter portion 35b is, fitted into the recesses 31c and 32c of the holding elements 31 and 32. The upper end portion of the lower large-diameter portion 35c is fitted into the recesses 31e and 32e of the holding elements 31 and 32. The flanges 31h and 32h of the holding elements 31 and 32 are fitted into the small-diameter intermediate portion 35a of the cleaning element 35.

Therefore, the cleaning element 35 is held securely. Even when the cleaning element 35 interferes with a protruding portion (i.e., the chuck 11) of the substrate holding/rotating mechanism 10, the cleaning element 35 is not liable to become detached or displaced from the holding elements 31 and 32. Further, when a cleaning operation for the substrate Wf is conducted continuously, there is no possibility of the cleaning operation continuing in the event that the cleaning element 35 does become detached from the holding elements.

In the above-mentioned cleaning member, the upper end portion of the lower large-diameter portion 35c of the cleaning element 35 is fitted into the recesses 31e and 32e of the holding elements 31 and 32. Therefore, when the lower end surface of the cleaning element 35 abuts against the substrate Wf and receives a force for lateral movement due to a lateral frictional force generated therebetween, an upper end side surface of the lower large-diameter portion 35c of the cleaning element 35 is held by engagement with the recesses 31e and 32e of the holding elements 31 and 32, so that lateral movement of the cleaning element 35 due to the lateral frictional force can be prevented.

An arrangement of the cleaning element 35 is not limited to the above-mentioned embodiment. The cleaning element 35 may have a form such as those shown in FIGS. 13(a) to 16(b). FIGS. 13(a), 14(a), 15(a) and 16(a) are side views of the cleaning elements, and FIGS. 13(b), 14(b), 15(b) and 16(b) are bottom views of the cleaning elements. The cleaning elements 35 shown in FIGS. 13(a) to 16(b) are the same in that the small-diameter intermediate portion 35a is formed at a portion to be held by the holding elements 31 and 32 and the upper large-diameter portion 35b and the lower large-diameter portion 35c are formed at the top and the bottom of the small-diameter intermediate portion 35a, respectively. On the other hand, the cleaning elements 35 in FIGS. 13(a) to 16(b) are different from each other in the following points.

Figure 13A:
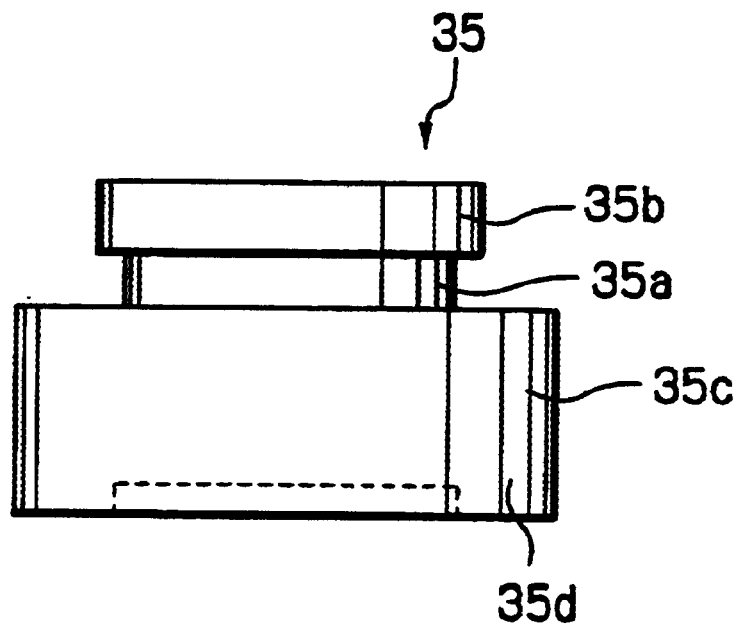
FIG. 13(a) is a side view of a cleaning element of the cleaning member of the present invention.
Figure 13B:
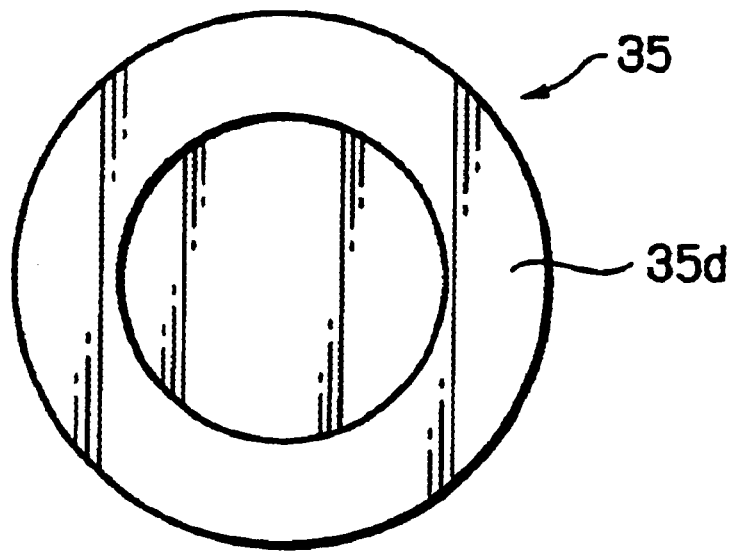
FIG. 13(b) is a bottom view of the cleaning element of FIG. 13(a).

The cleaning element 35 shown in FIGS. 13(a) and 13(b) includes an annular protrusion 35d formed at an outer circumferential portion of the lower end surface of the cleaning element 35. The annular protrusion 35d has an even surface to be brought into contact with a substrate during cleaning. In this arrangement of the cleaning element 35, since downward-facing surfaces of the recesses 31e and 32e of the holding elements 31 and 32 abut against an outer circumferential upper surface of the lower large-diameter portion 35c of the cleaning element 35, the substrate Wf is cleaned while it is pressed against the even surface of the annular protrusion 35d under uniform contact pressure.

Figure 14A:
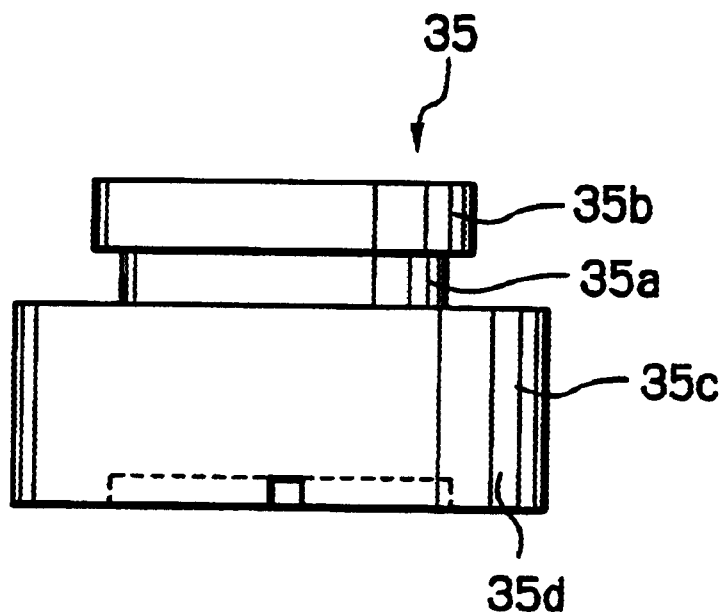
FIG. 14(a) is a side view of a cleaning element of the cleaning member of the present invention.
Figure 14B:
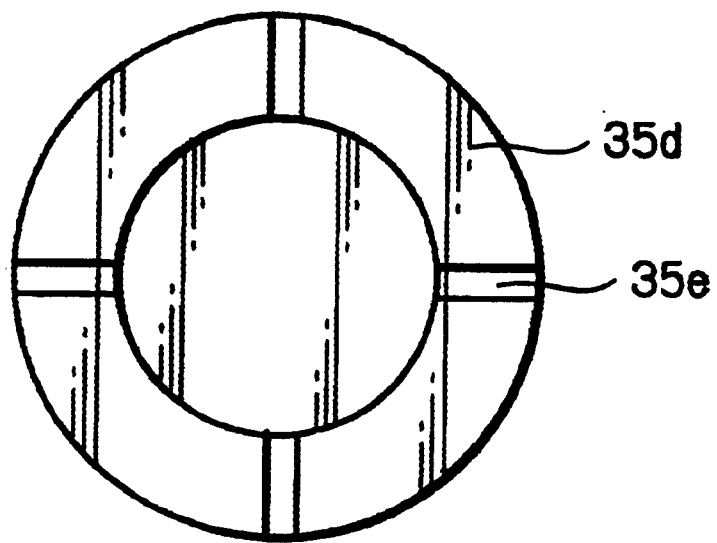
FIG. 14(b) is a bottom view of the cleaning element of FIG. 14(a).

In the cleaning element 35 shown in FIGS. 14(a) and 14(b), a plurality of radial grooves 35e are formed in the annular protrusion 35d at the outer circumferential portion of the lower end surface of the cleaning element 35, thus dividing the annular protrusion 35d into a plurality of sections [four in FIG. 14(b)]. By this arrangement of the cleaning element 35, the cleaning liquid supplied onto the upper surface of the substrate Wf flows through the grooves 35e, so that cleaning can be conducted more effectively.

Figure 15A:
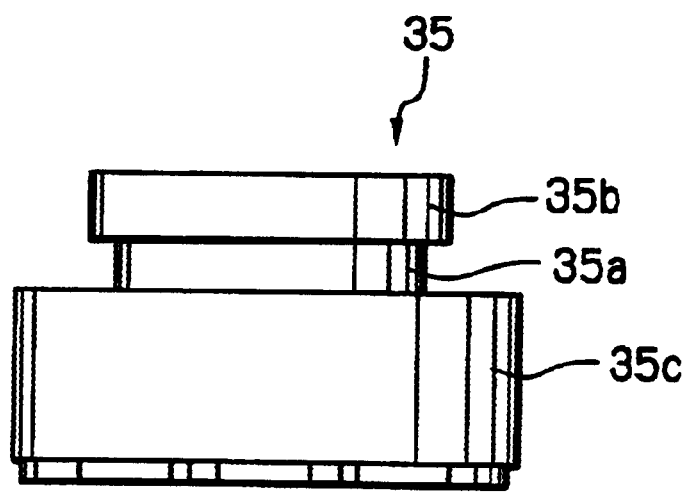
FIG. 15(a) is a side view of a cleaning element of the cleaning member of the present invention.
Figure 15B:
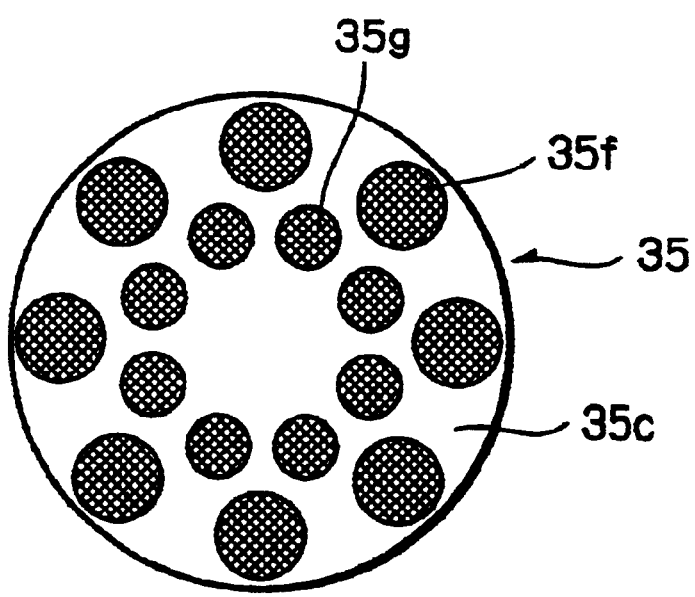
FIG. 15(b) is a bottom view of the cleaning element of FIG. 15(a).

In the cleaning element 35 shown in FIGS. 15(a) and 15(b), a plurality of protrusions 35f and 35g in the form of circular plates are formed on the lower end surface of the cleaning element 35. The protrusions 35f and 35g are arranged at a predetermined pitch angle in a concentric circular configuration. In this embodiment, a plurality of protrusions 35f having large diameters are arranged at a predetermined pitch angle on a radially outer side and a plurality of protrusions 35g having small diameters are arranged at a predetermined pitch angle on a radially inner side. By this arrangement, the cleaning liquid flows through passages between the protrusions 35f and 35g, thereby improving the effect of cleaning.

In the cleaning member 35 shown in FIGS. 7 to 12, the holding elements 31 and 32 providing a holding mechanism for holding the cleaning element 35, the driving force transmission member 33 and the cylindrical fastening member 34 are not particularly limited in terms of a material employed. These members are made of, for example, plastics. As examples of such plastics, there can be mentioned PVC (polyvinyl chloride), PE (polyethylene), PP (polypropylene), PET (polyethylene terephthalate), PVDF (polyvinylidene fluoride), PEEK (polyether ether ketone), PTFE (polytetrafluoroethylene), etc.

In the above-mentioned embodiment, the cleaning element 35 is made of a PVA (polyvinyl alcohol) sponge [porous matrix PVF (polyvinyl formal)]. However, a material for the cleaning element 35 is not particularly limited, as long as it is a liquid-absorbent porous body.

Figure 16A:
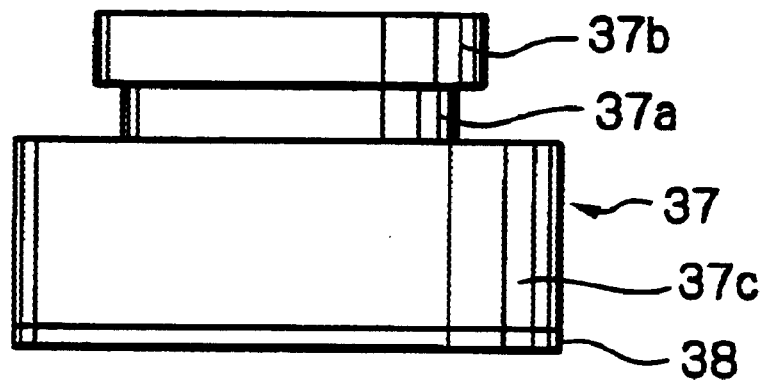
FIG. 16(a) is a side view of a cleaning element of the cleaning member of the present invention.
Figure 16B:
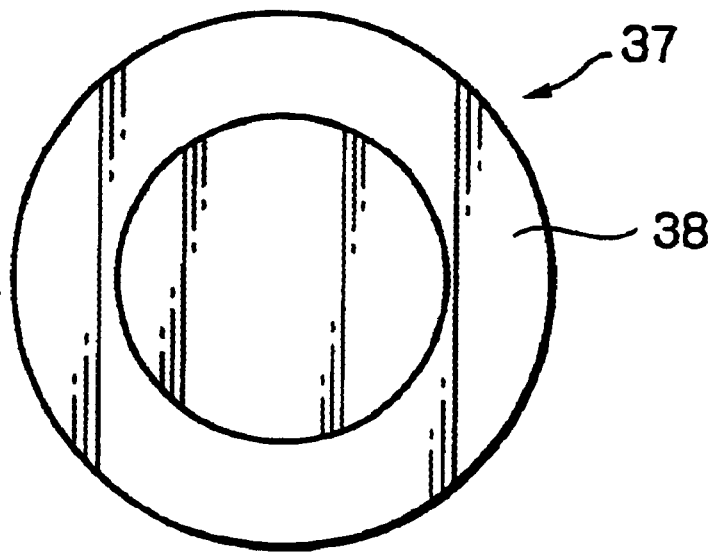
FIG. 16(b) is a bottom view of the cleaning element of FIG. 16(a).

In the above-mentioned embodiment, the cleaning element 35 made of a porous body such as a PVA sponge is held by the holding elements 31 and 32. However, as shown in FIGS. 16(a) and 16(b), a cloth holding element 37 having an annular cloth 38 adhered to a lower surface thereof may be held by the holding elements 31 and 32. The form of the cloth holding element 37 is substantially the same as that of the cleaning element 35. That is, the cloth holding element 37 comprises a small-diameter intermediate portion 37a having a small diameter formed at a portion thereof to be held by the holding elements 31 and 32, an upper large-diameter portion 37b in a flange-like form disposed at the top of the small-diameter intermediate portion 37a and a lower large-diameter portion 37c in a cylindrical form disposed at the bottom of the small-diameter intermediate portion 37a.

As a material for the cloth holding element 37, use can be made of plastics, FKM (fluororubber), EPDM (ethylene propylene rubber), urethane rubber, etc. The cloth 38 should be one including fine pores formed in its surface, such as a cloth made of urethane foam, a nonwoven cloth comprising fibers fixed by a urethane resin or a suede-type polishing cloth. By using such a cloth, foreign matter such as dust removed from the surface of the substrate Wf due to friction between it and the cloth 38 are taken into the pores.

As the cleaning member using the cloth 38, use of a member is preferred wherein the cloth 38 is adhered to the cloth holding element 37 made of a flexible material (such as rubber), the cloth 38 being made of a harder material than the cloth holding element 37. However, an arrangement of the cleaning member using the cloth 38 is not limited to this example. A cleaning member comprising the cloth, holding element 37 and the cloth 38 formed integrally therewith or a cleaning member comprising the cloth holding element 37 made of a non-elastic plastic material and the cloth 38 adhered thereto may also be used.

Figure 18:
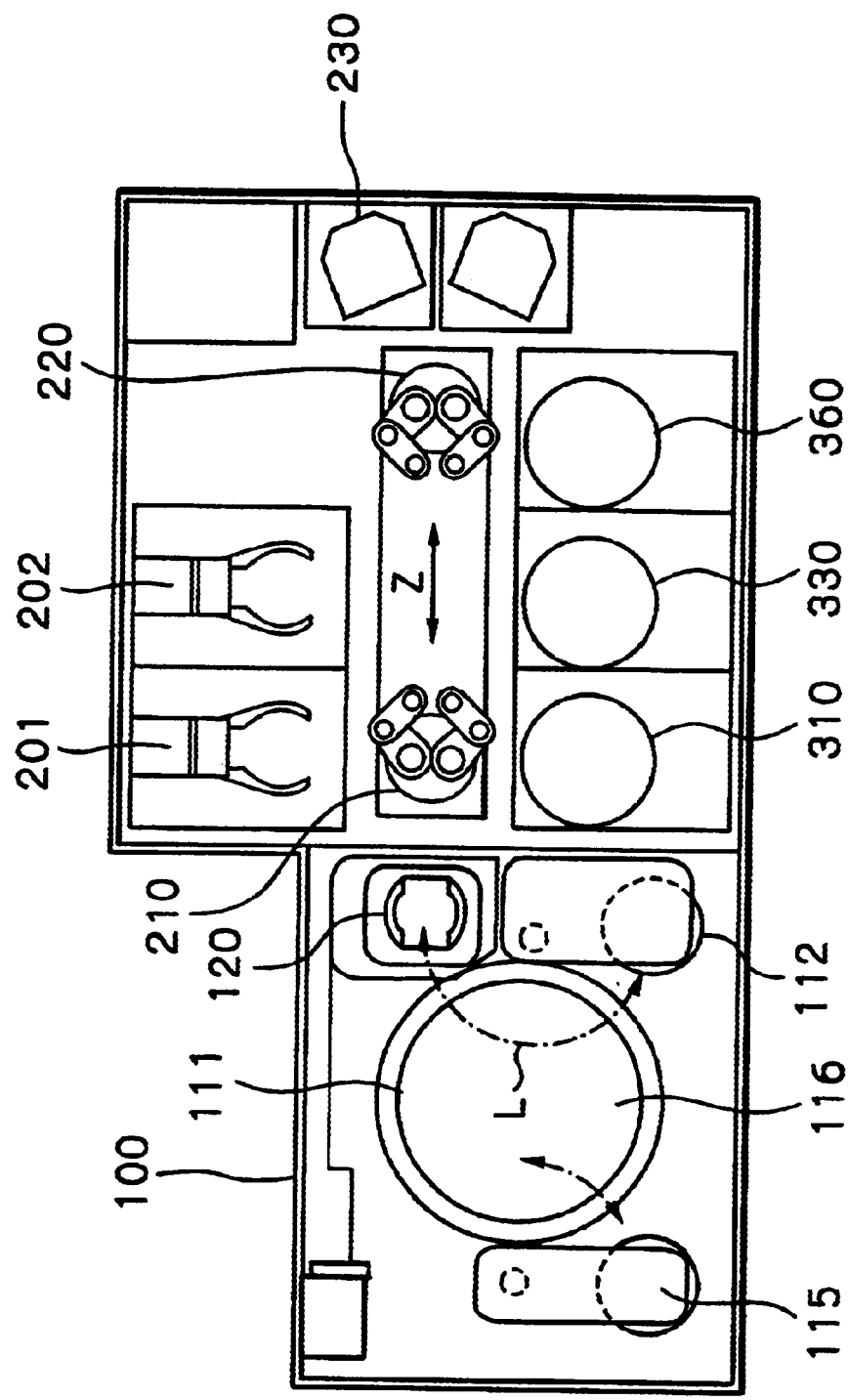
FIG. 18 Is a schematic plan view of a substrate polishing apparatus in which a substrate cleaning apparatus in accordance with the present invention may be employed.

FIG. 18 is a schematic plan view of a substrate polishing apparatus in which a substrate cleaning apparatus in accordance with the present invention is employed. The polishing apparatus includes a substrate cassette loading/unloading station 230, substrate transfer robots 210, 220, a substrate cleaning station including first through third cleaning apparatuses 310, 330 and 360, and a substrate polishing station. The substrate polishing station includes a turntable 111 having a polishing surface 116, and a substrate carrier 112 for holding a substrate and bringing it into contact with the polishing surface 116 for polishing of the substrate.

The robots 201 and 220 are operable to transfer substrates between substrate cassettes loaded in the cassette loading/unloading station 230 and the substrate polishing station 100, specifically, a substrate lift 120 located in the polishing station 100.

In the polishing station 100, the substrate carrier 112 is movable or pivotable along a path designated by a phantom line L from a retracted position shown in FIG. 18 so that the substrate carrier 112 removes a substrate from the substrate lift 120 and moves it on the polishing surface 116 for conducting polishing of the substrate and, after polishing, returns the polished substrate to the substrate lift 120. In the polishing station 100, a polishing surface conditioning or dressing tool 115 is provided which is pivotable as shown by arched arrows in FIG. 18.

Any one of the first through the third substrate cleaning apparatuses 310, 330 and 360 may be constructed as shown in the aforementioned embodiments of the present invention. In FIG. 18, reference numerals 201 and 202 designate substrate reversing devices.

When the robots 210 and 220 transfer a substrate which has been polished in the polishing station.

As has been described above, the present invention is advantageous in the following points.

By providing a cleaning element sensor, accidental detachment of the cleaning element of the cleaning member can be surely detected. Therefore, operation of the substrate cleaning apparatus can be stopped at the time of detection of detachment of the cleaning element, thus preventing production of insufficiently cleaned products.

The cleaning element sensor can be easily set to a position such that movement of the cleaning member holding mechanism during a cleaning operation is not disturbed Defects in cleaning due to detachment of the cleaning element can be substantially eliminated.

The cleaning element is held by a plurality of orthogonally intersecting surfaces, thereby preventing detachment of the cleaning element.

The protrusions of the holding elements bite into (pierce) the cleaning element. Therefore, a force of rotation of the holding elements can be surely transmitted to the cleaning element and idle rotation of the cleaning element in the holding elements can be prevented.

It should be noted that the present invention is not necessarily limited to the foregoing embodiments but can be modified in a variety of ways without departing from the gist of the present invention.

What is claimed is:

1. A substrate cleaning member for use in a substrate cleaning apparatus, the cleaning member being adapted to be held and brought into contact with a substrate for cleaning by a cleaning member carrier of the substrate cleaning apparatus, wherein the cleaning member has a fitting portion to be held by a cleaning member carrier, the fitting portion having a large diameter head portion and a small diameter neck portion integrally connected to the large diameter head portion to enable the cleaning member carrier to securely hold the cleaning member by grasping the fitting portion, wherein the cleaning member carrier comprises at least two semi-cylindrical cleaning member holding elements, which are fastened to the cleaning member by a fastening member so as to be rotatable together with the cleaning member.

2. A substrate cleaning member for use in a substrate cleaning apparatus, the cleaning member being adapted to be held and brought into contact with a substrate for cleaning by a cleaning member carrier of the substrate cleaning apparatus, the cleaning member comprising:

a fitting portion to be held by a cleaning member carrier, the fitting portion having a large diameter head portion and a small diameter neck portion integrally connected to the large diameter head portion to enable the cleaning member carrier to securely hold the cleaning member by grasping the fitting portion; and a cleaning portion integrally connected to the small diameter neck portion at an end thereof opposite to the other end at which the large diameter head portion is connected, the cleaning portion having a diameter that is larger than that of the small diameter neck portion.

3. A substrate cleaning member as set forth in claim 2, wherein the large diameter head portion, the small diameter neck portion and the cleaning portion are each cylindrical and coaxial with each other.

4. A cleaning apparatus for cleaning a substrate, the cleaning apparatus comprising:

a cleaning member; and a cleaning member carrier for holding the cleaning member and bringing the cleaning member into contact with a substrate to be cleaned, wherein:

the substrate is cleaned by causing relative movement between the cleaning member and the substrate while keeping the cleaning member and the substrate in contact with each other;

the cleaning member has a fitting portion to be held by the cleaning member carrier, the fitting portion having a large diameter head portion and a small diameter neck portion integrally connected to the large diameter head portion to enable the cleaning member carrier to securely hold the cleaning member by grasping the fitting portion, and the cleaning member carrier comprises at least two semi-cylindrical cleaning member holding elements, which are fastened to the cleaning member by a fastening member so as to be rotatable together with the cleaning member.

5. A cleaning apparatus as set forth in claim 4, wherein each of the holding elements has a recess formed in an outer surface thereof for receiving a driving force transmission member.

6. A cleaning apparatus for cleaning a substrate, the cleaning apparatus comprising:

a cleaning member; and a cleaning member carrier for holding the cleaning member and bringing the cleaning member into contact with a substrate to be cleaned, wherein:

the substrate is cleaned by causing relative movement between the cleaning member and the substrate while keeping the cleaning member and the substrate in contact with each other; and the cleaning member comprises a fitting portion to be held by the cleaning member carrier, the fitting portion having a large diameter head portion and a small diameter neck portion integrally connected to the large diameter head portion to enable the cleaning member carrier to securely hold the cleaning member by grasping the fitting portion, and the cleaning member further comprises a cleaning portion integrally connected to the small diameter neck portion at an end thereof opposite to the other end at which the large diameter head portion is connected, the cleaning portion having a diameter that is larger than that of the small diameter neck portion.

7. A cleaning apparatus as set forth in claim 6, wherein the large diameter head portion, the small diameter neck portion and the cleaning portion are each cylindrical and coaxial with each other.

8. A cleaning apparatus as set forth in claim 6, wherein the cleaning member carrier comprises a cleaning member holder having an inner space configured to securely receive the large diameter head portion, the small diameter neck portion and a portion of the cleaning portion adjacent to the small diameter neck portion, the cleaning member holder including a plurality of segments which are releasably engaged with the cleaning member so as to hold the cleaning member.

9. A cleaning apparatus as set forth in claim 8, wherein he cleaning member holder further comprises an inner wall defining the inner space and at least one protrusion provided on the inner wall to be pressed into the cleaning member when the cleaning member is held by the cleaning member holder.

* * * * *